(12) United States Patent
Nakamata et al.

(10) Patent No.: US 11,063,123 B2
(45) Date of Patent: Jul. 13, 2021

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Shin'ichi Nakamata, Matsumoto (JP); Masanobu Iwaya, Matsumoto (JP); Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/521,201

(22) Filed: Jul. 24, 2019

(65) Prior Publication Data
US 2020/0091299 A1 Mar. 19, 2020

(30) Foreign Application Priority Data
Sep. 14, 2018 (JP) .............................. JP2018-173121

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02186* (2013.01); *H01L 21/02458* (2013.01);
(Continued)

(58) Field of Classification Search
CPC .......... H01L 29/1608; H01L 21/02186; H01L 21/02507; H01L 29/7813; H01L 21/76816;
(Continued)

(56) References Cited
U.S. PATENT DOCUMENTS

2005/0255706 A1* 11/2005 Ishida ............. H01L 21/823487
438/758
2012/0280255 A1 11/2012 Masuda et al.
(Continued)

FOREIGN PATENT DOCUMENTS

JP 2005-327799 A 11/2005
JP 2012-099601 A 5/2012
(Continued)

*Primary Examiner* — Edward Chin
(74) *Attorney, Agent, or Firm* — Rabin & Berdo, P.C.

(57) ABSTRACT

At an upper surface of a gate electrode, a recess occurs due to etching back of poly-silicon for forming the gate electrode. At an upper surface of an interlayer insulating film, a recess occurs in a portion that opposes in a depth direction, the recess of the upper surface of the gate electrode. A barrier metal includes sequentially stacked first to fourth metal films. The first metal film is a titanium nitride film that covers the surface of the interlayer insulating film and has an opening that exposes the recess of the upper surface of the interlayer insulating film. The second metal film is a titanium film that covers the first metal film and the source electrode, and is in contact with the interlayer insulating film, in the opening of the first metal film. The third and fourth metal films are a titanium nitride film and a titanium film, respectively.

13 Claims, 13 Drawing Sheets

(51) Int. Cl.
  *H01L 29/78* (2006.01)
  *H01L 21/768* (2006.01)
  *H01L 29/423* (2006.01)
  *H01L 29/66* (2006.01)
(52) U.S. Cl.
  CPC .. *H01L 21/02507* (2013.01); *H01L 21/76816* (2013.01); *H01L 29/4236* (2013.01); *H01L 29/66734* (2013.01); *H01L 29/7813* (2013.01)
(58) Field of Classification Search
  CPC ........... H01L 29/4236; H01L 29/66734; H01L 21/02458; H01L 29/45; H01L 29/41741; H01L 29/0878; H01L 23/53223; H01L 29/401; H01L 29/66348; H01L 29/417; H01L 29/1095; H01L 29/0623; H01L 29/7396; H01L 29/7397
  See application file for complete search history.

(56) References Cited

U.S. PATENT DOCUMENTS

| | | | |
|---|---|---|---|
| 2015/0060848 A1* | 3/2015 | Sasagawa | H01L 27/1225 257/43 |
| 2015/0155362 A1* | 6/2015 | Nakazawa | H01L 29/45 257/43 |
| 2016/0247910 A1 | 8/2016 | Suzuki et al. | |
| 2016/0336412 A1* | 11/2016 | Hung | H01L 29/66636 |
| 2020/0350403 A1* | 11/2020 | Basker | H01L 29/1037 |

FOREIGN PATENT DOCUMENTS

| | | |
|---|---|---|
| JP | 2015-072999 A | 4/2015 |
| JP | 2018-082054 A | 5/2018 |

* cited by examiner

FIG.12

| | RATE OF DEFECTS BETWEEN GATE AND SOURCE | DEFECTIVE CHIP COUNT | COUNT OF CHIPS HAVING CRACKS IN BARRIER METAL |
|---|---|---|---|
| FIRST EXAMPLE | 2.1% | 63 | 0 |
| SECOND EXAMPLE | 1.8% | 54 | 0 |
| CONVENTIONAL EXAMPLE | 3.9% | 169 | 46 |

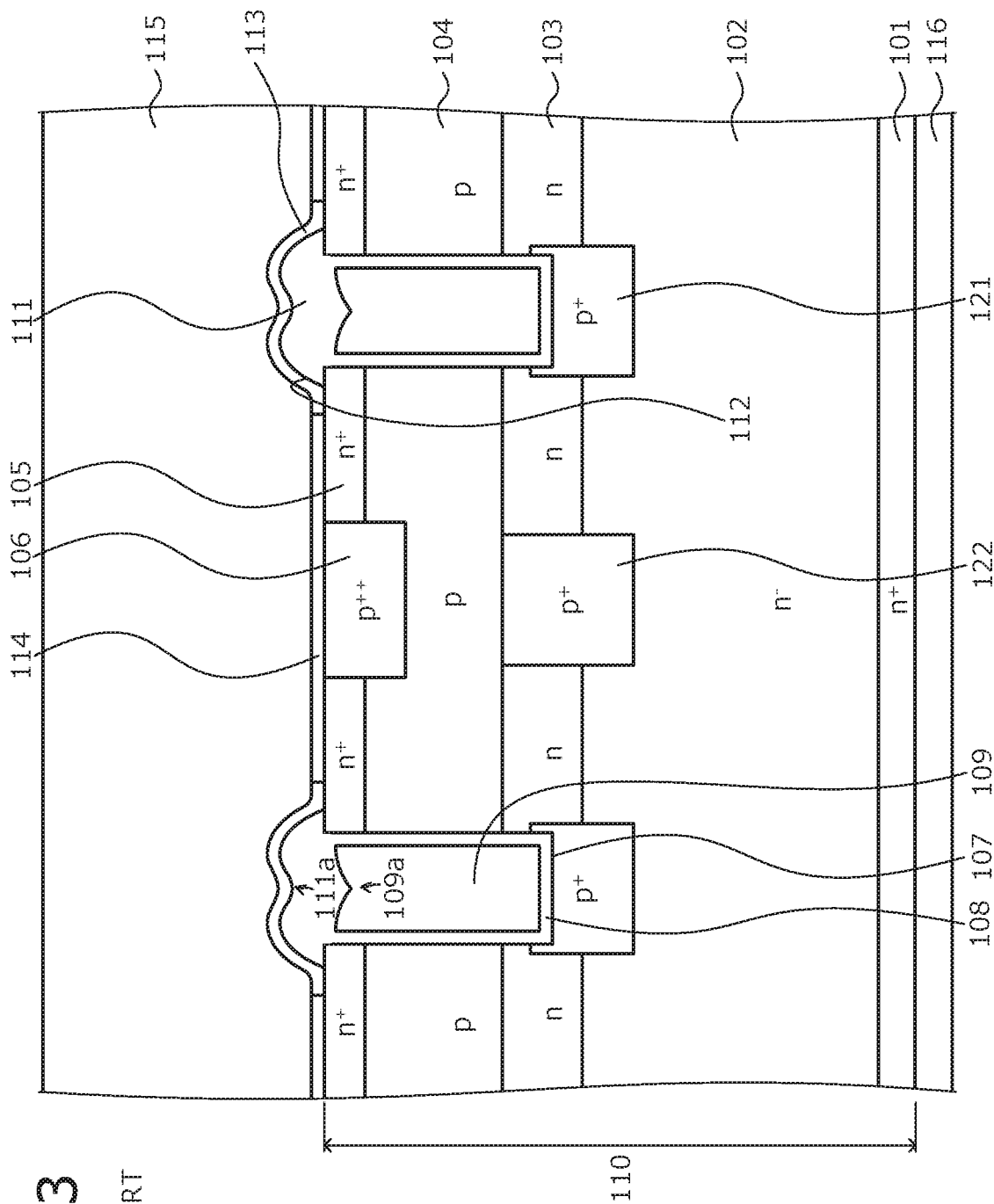

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-173121, filed on Sep. 14, 2018, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next generation semiconductor material. A semiconductor element (hereinafter, silicon carbide semiconductor device) that uses silicon carbide as a semiconductor material has various advantages such as use under environments of higher temperatures (200 degrees C. or higher) and enabling resistance of an element in an ON state to be reduced to a few hundredths as compared to a conventional semiconductor element that uses silicon as a semiconductor material. This is a consequence of characteristics of the material itself such as silicon carbide having a bandgap that is about 3 times larger than that of silicon and dielectric breakdown field strength that is nearly 10 times larger than that of silicon.

Up until now, a Schottky barrier diode (SBD), a vertical metal oxide semiconductor field effect transistor (MOSFET) having an insulated gate with a 3-layer structure constituted by a metal, an oxide film, and a semiconductor material in a planar gate structure or a trench gate structure have been commercialized as a silicon carbide semiconductor device.

A trench gate structure is a 3-dimensional structure in which a MOS gate (insulated gate constituted by a metal, an oxide, and a semiconductor material) is embedded in a trench formed in a semiconductor substrate containing silicon carbide and in which a portion along a side wall of the trench is used as a channel (inversion layer). Therefore, as compared to a case of elements having the same ON resistance (Ron), the trench gate structure enables the element area (chip area) to be made significantly smaller than in a planar gate structure in which the MOS gate is provided in flat planar shape on a semiconductor substrate. Thus, the trench gate structure may be said to be a promising structure.

A structure of a conventional silicon carbide semiconductor device will be described taking a vertical MOSFET having a trench gate structure as an example. FIG. 13 is a cross-sectional view of a structure of the conventional silicon carbide semiconductor device. The conventional silicon carbide semiconductor device depicted in FIG. 13 includes on a front surface side of a semiconductor substrate (semiconductor chip) 110 that contains silicon carbide, a MOS gate having a general trench gate structure. The MOS gate is constituted by a p-type base region 104, an $n^+$-type source region 105, a $p^{++}$-type contact region 106, a trench 107, a gate insulating film 108, and a gate electrode 109.

An interlayer insulating film 111 is provided at a front surface of the semiconductor substrate 110 overall so as to cover the gate electrode 109. In a contact hole 112 of the interlayer insulating film 111, the $n^+$-type source region 105 and the $p^{++}$-type contact region 106 are exposed. A barrier metal 113 covers only a surface of the interlayer insulating film 111. In the contact hole 112 of the interlayer insulating film 111, a source electrode 114 forms an ohmic contact with the $n^+$-type source region 105 and the $p^{++}$-type contact region 106.

A source pad 115 is embedded in the contact hole 112 of the interlayer insulating film 111 and covers a portion of the semiconductor substrate 110 exposed in the contact hole 112 and a surface of the barrier metal 113. Reference numerals 101, 103, and 116 are an $n^+$-type drain region, an n-type current spreading layer (CSL), and a drain electrode, respectively. Reference numerals 121 and 122 are $p^+$-type regions that control electric field applied to the gate insulating film 108 during an OFF state of the MOSFET.

As a vertical MOSFET having such a conventional trench gate structure, a device has been proposed in which at least a portion of a source electrode constituted by nickel (Ni) connected to a $n^+$-type source region is converted into a silicide, thereby forming an ohmic contact with the $n^+$-type source region (for example, refer to Japanese Laid-Open Patent Publication No. 2012-099601 (paragraph 0025, FIG. 1) and Japanese Laid-Open Patent Publication No. 2015-072999 (paragraph 0025, FIG. 1)).

Further, as a vertical MOSFET having the conventional trench gate structure, a device has been proposed in which a barrier metal constituted by a metal film containing titanium (Ti) forms a contact (electrical contact) between an $n^+$-type source region and a p-type base region and extends so as to cover a surface of an interlayer insulating film; and in part of the portion of the barrier metal covering the surface of the interlayer insulating film, is an opening (for example, refer to Japanese Laid-Open Patent Publication No. 2005-327799 (paragraph 0045, FIG. 1)).

Further, as a vertical MOSFET having the conventional trench gate structure, a device has been proposed in which conditions of a thickness of a barrier metal, material composition and thickness of a stacked structure of an interlayer insulating film, etc. are set so that during a heat treatment for reflow, wire bonding, and product use, cracks in the barrier metal and in the interlayer insulating film are prevented (for example, refer to Japanese Laid-Open Patent Publication No. 2018-082054 (paragraphs 0046 to 0049, FIG. 1)).

SUMMARY OF THE INVENTION

According to an embodiment, a silicon carbide semiconductor device includes a semiconductor substrate that contains silicon carbide, the semiconductor substrate including: a base substrate; a first semiconductor region that is of a first conductivity type and is disposed on the base substrate at a front side of the semiconductor substrate; a second semiconductor region that is of a second conductivity type, and is disposed on the first semiconductor region at the front side of the semiconductor substrate; and a third semiconductor region that is of the first conductivity type and is selectively provided in the second semiconductor region at the front side of the semiconductor substrate; a trench that penetrates the third semiconductor region and the second semiconductor region, and reaches the first semiconductor region; a gate electrode that is provided in the trench, via a gate insulating film; an interlayer insulating film that covers the gate electrode; a contact hole that penetrates the interlayer insulating film, reaches the semiconductor substrate and exposes the third semiconductor region; a barrier metal that covers the interlayer insulating film; a first electrode that in the contact hole, is electrically connected to the second semiconductor region and the third semiconductor region; and a second electrode provided at a rear side of the semiconductor substrate. The gate electrode has a recess at a position corresponding to the trench in a plan view of the silicon carbide semiconductor device, the recess being recessed from the front side of the semiconductor substrate toward the rear side of the semiconductor substrate. The interlayer insulating film has a recess at a position corresponding to the position of the recess of the gate electrode in the plan view. The barrier metal has a groove of a predetermined depth at a position corresponding to the position of the recess of the interlayer insulating film in the plan view.

In the embodiment, the groove of the barrier metal penetrates the barrier metal and exposes a surface of the recess of the interlayer insulating film.

In the embodiment, the barrier metal has a first portion in the groove and a second portion other than the first portion, the first portion having a thickness less than a thickness of the second portion.

In the embodiment, the thickness of the first portion of the barrier metal is at most one-fifth of a thickness of the second portion of the barrier metal.

In the embodiment, the groove has a width in a direction parallel to a surface of the semiconductor substrate in a range from 0.5 µm to 1.5 µm.

In the embodiment, the width of the groove is in a range from 0.8 µm to 1.2 µm.

In the embodiment, the recess of the gate electrode has a substantially V-shaped cross-sectional shape and has a deepest point at a center of the trench in the plan view. The recess of the interlayer insulating film has a substantially V-shaped cross-sectional shape corresponding to a shape of the recess of the gate electrode. The groove overlaps in the plan view the deepest point of the recess of the interlayer insulating film.

In the embodiment, the barrier metal is a titanium nitride film.

In the embodiment, the barrier metal has a four-layer structure constituted by: a first titanium nitride film that directly contacts the interlayer insulating film and has the groove, a first titanium film that directly contacts the first titanium nitride film and the first electrode, a second titanium nitride film that directly contacts the first titanium film, and a second titanium film that directly contacts the second titanium nitride film.

According to another embodiment, a silicon carbide semiconductor device includes a semiconductor substrate that contains silicon carbide, the semiconductor substrate including: a base substrate; a first semiconductor region that is of a first conductivity type and is disposed on the base substrate at a front side of the semiconductor substrate; a second semiconductor region that is of a second conductivity type, and is disposed on the first semiconductor region at the front side of the semiconductor substrate; and a third semiconductor region that is of the first conductivity type and is selectively provided in the second semiconductor region at the front side of the semiconductor substrate; a trench that penetrates the third semiconductor region and the second semiconductor region, and reaches the first semiconductor region; a gate electrode that is provided in the trench, via a gate insulating film; an interlayer insulating film that covers the gate electrode; a contact hole that penetrates the interlayer insulating film and exposes the third semiconductor region; a barrier metal that covers the interlayer insulating film; a first electrode that in the contact hole, is electrically connected to the second semiconductor region and the third semiconductor region; and a second electrode provided at a rear side of the semiconductor substrate. The barrier metal has a four-layer structure constituted by: a first titanium nitride film that is disposed directly on the interlayer insulating film and has an opening that exposes a portion of the interlayer insulating film, a first titanium film that is disposed directly on the first titanium nitride film and the first electrode, and is in direct contact with the interlayer insulating film in the opening of the first titanium nitride film, a second titanium nitride film that is disposed directly on the first titanium film, and a second titanium film that is disposed directly on the second titanium nitride film.

According to another embodiment, a method of manufacturing a silicon carbide semiconductor device includes fabricating a semiconductor substrate that contains silicon carbide, the semiconductor substrate including a base substrate, a first semiconductor region of a first conductivity type, disposed on the base substrate at a front side of the semiconductor substrate, and a second semiconductor region of a second conductivity type, disposed on the first semiconductor region at the front side of the semiconductor substrate; selectively forming a third semiconductor region of the first conductivity type in the second semiconductor region; forming a trench to penetrate the third semiconductor region and the second semiconductor region and reach the first semiconductor region; forming a gate insulating film along an inner wall of the trench; depositing a poly-silicon layer on a front surface of the semiconductor substrate and embedding the poly-silicon layer on the gate insulating film in the trench; etching and removing the poly-silicon layer with an etch back process to form a gate electrode in the trench; forming the interlayer insulating film to cover the gate electrode; forming a contact hole that penetrates the interlayer insulating to expose the third semiconductor region in the contact hole; forming a barrier metal to cover the interlayer insulating film; forming a first electrode that is electrically connected to the second semiconductor region and the third semiconductor region, in the contact hole; and forming a second electrode at a rear side of the semiconductor substrate. During the etch back process, a recess that is recessed from the front side of the semiconductor substrate toward the rear side of the semiconductor substrate is formed at a surface of the gate electrode. During the forming of the interlayer insulating film, a recess is formed at a surface of the interlayer insulating film at a position corresponding to a position the recess of the gate electrode in a plan view of the silicon carbide semiconductor device. Forming the barrier metal includes forming a groove of a predetermined depth in the barrier metal at a position corresponding to the position of the recess of the interlayer insulating film in the plan view.

In the embodiment, forming the groove of the barrier metal includes forming in the barrier metal, an opening that penetrates the barrier metal to exposes a surface of the recess of the interlayer insulating film.

In the embodiment, forming the barrier metal includes forming in the barrier metal, a first portion at a position corresponding to the position of the recess of the interlayer insulating film in the plan view, the first portion having a thickness less than a thickness of the barrier metal other than the first portion.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 12 is a table of unfavorable instances between a gate and a source of a silicon carbide semiconductor device according to first and second examples; and FIG. 13 is a cross-sectional view of a structure of a conventional silicon carbide semiconductor device.

DETAILED DESCRIPTION OF THE INVENTION

Figure 1:
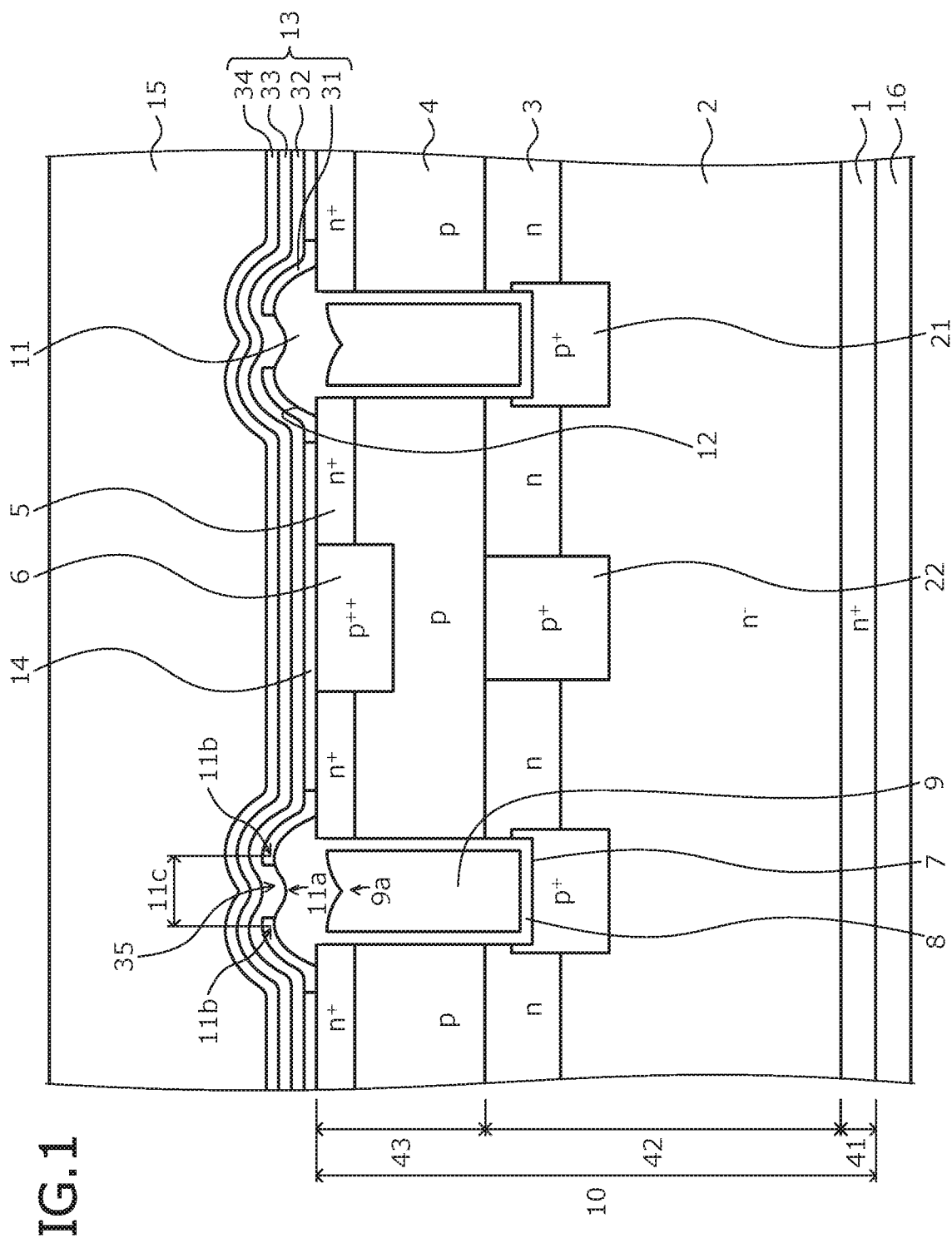
FIG. 1 is a cross-sectional view of a structure of a silicon carbide semiconductor device according to a first embodiment.

First, problems associated with the conventional techniques will be discussed. Through the earnest research of the inventor, the following problems were found to occur during the fabrication (manufacturing) of the described conventional silicon carbide semiconductor device (refer to FIG. 13). In the described conventional silicon carbide semiconductor device, in forming the MOS gate on a front surface side of the semiconductor substrate 110, the gate electrode 109 is formed by depositing poly-silicon (poly-Si) on the front surface of the semiconductor substrate 110 so as to be embedded in the trench 107, and etching back the poly-silicon so that the poly-silicon remains only in the trench 107. Thus, a recess 109a occurs at an upper surface of the gate electrode 109 due to the etching back of the poly-silicon.

Next, the interlayer insulating film 111 is formed on the front surface of the semiconductor substrate 110 overall so as to cover the gate electrode 109. A recess 111a occurs in a surface of the interlayer insulating film 111 due to the recess 109a at the upper surface of the gate electrode 109 below. Next, the interlayer insulating film 111 and the gate insulating film 108 are selectively removed, thereby forming the contact hole 112 and exposing the $n^+$-type source region 105 and the $p^{++}$-type contact region 106 in the contact hole 112. As a result of forming the contact hole 112, the interlayer insulating film 111 is provided only on top of the gate electrode 109 and the trench 107.

Next, the interlayer insulating film 111 is planarized by a heat treatment (reflow). Even after the reflow, the recess 111a formed due to the recess 109a of the upper surface of the gate electrode 109 below when the interlayer insulating film 111 is deposited remains at an upper surface of the interlayer insulating film 111. Next, after the barrier metal 113 is formed so as to cover the interlayer insulating film 111, the barrier metal 113 is selectively removed so that a portion thereof remains covering the surface of the interlayer insulating film 111 overall and the $n^+$-type source region 105 and the $p^{++}$-type contact region 106 are again exposed in the contact hole 112. The barrier metal 113 is curved along the interlayer insulating film 111 below.

Next, the source electrode 114 is formed on surfaces of the $n^+$-type source region 105 and the $p^{++}$-type contact region 106 exposed in the contact hole 112. Next, the source electrode 114 is converted into a silicide by annealing and thereby, forms an ohmic contact with the $n^+$-type source region 105 and the $p^{++}$-type contact region 106. Due to the annealing for converting the source electrode 114 into a silicide, metal atoms in the source electrode 114 may penetrate the interlayer insulating film 111, leading to unfavorable instances such as decreases in the breakdown voltage between a gate and a source and the occurrence of leak current. Therefore, before the formation of the source electrode 114, the surface of the interlayer insulating film 111 overall is covered by the barrier metal 113.

Nonetheless, reflow at a temperature of about 900 degrees C. that easily planarizes the interlayer insulating film 111 is possible and therefore, expansion and contraction easily occurs due to an annealing process performed after formation of the barrier metal 113. On the other hand, the barrier metal 113 is hard and curved along the recess 111a of the upper surface of the interlayer insulating film 111 and thus, has a low capability to tolerate stress. Therefore, cracks (fractures) may occur in the barrier metal 113 as a consequence of stress that occurs due to the expansion and contraction of the interlayer insulating film 111. Migration of impurity atoms from these cracks in the barrier metal 113, toward the interlayer insulating film 111 is surmised to be one factor leading to unfavorable instances between the gate and the source.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of the silicon carbide semiconductor device according to a first embodiment will be described. FIG. 1 is a cross-sectional view of a structure of the silicon carbide semiconductor device according to the first embodiment. The silicon carbide semiconductor device according to the first embodiment and depicted in FIG. 1 is a MOSFET that includes on a front surface side of a semiconductor substrate (semiconductor chip) 10 that contains silicon carbide (SiC), a MOS gate having a trench gate structure, and the silicon carbide semiconductor device according to the first embodiment has a barrier metal 13 on an interlayer insulating film 11 that covers a gate electrode 9 constituting the MOS gate.

The semiconductor substrate 10, for example, is a silicon carbide epitaxial substrate in which an n⁻-type silicon carbide layer 42 and a p-type silicon carbide layer 43 respectively constituting an n⁻-type drift region (first semiconductor region) 2 and a p-type base region (second semiconductor region) 4 are formed sequentially by epitaxial growth on a front surface of an n⁺-type starting substrate 41 that contains silicon carbide. The n⁺-type starting substrate 41 constitutes an n⁺-type drain region (first semiconductor region) 1. The semiconductor substrate 10 has a front surface that is a main surface on a p-type silicon carbide layer 43 side of the semiconductor substrate 10 and a rear surface (rear surface of the n⁺-type starting substrate 41) that is a main surface on an n⁺-type starting substrate 41 side of the semiconductor substrate.

The MOS gate is constituted by the p-type base region 4, an n⁺-type source region (third semiconductor region) 5, a p⁺⁺-type contact region 6, a trench 7, a gate insulating film 8, and the gate electrode 9. In particular, an n-type current diffusion region 3 and first and second p⁺-type regions 21, 22 may be provided in the n⁻-type silicon carbide layer 42. A portion of the n⁻-type silicon carbide layer 42 excluding the n-type current diffusion region 3 and the first and the second p⁺-type regions 21, 22 constitutes the n⁻-type drift region 2.

The n-type current diffusion region 3 is a so-called current spreading layer (CSL) that reduces carrier spreading resistance. The n-type current diffusion region 3 is provided between (mesa region) the trench 7 and an adjacent trench 7 that sandwich the mesa region. The n-type current diffusion region 3 reaches a side wall of the trench 7 and a side wall of the adjacent trench 7. The n-type current diffusion region 3 is in contact with the p-type base region 4, and from an interface between the p-type base region 4 and the n-type current diffusion region 3, reaches a position closer to a drain (closer to the n⁺-type starting substrate 41) than is a bottom of the trench 7.

The first p⁺-type region 21 is provided separated from the p-type base region 4, at a position closer to the drain than is the p-type base region 4, and opposes the bottom of the trench 7 in a depth direction (vertical direction). The second p⁺-type region 22, in the mesa region, is in contact with the p-type base region 4 and provided separated from the first p⁺-type region 21 and the trench 7. The first and the second p⁺-type regions 21, 22 have a function of suppressing electric field applied to the gate insulating film 8 when the MOSFET is in an OFF state.

The n⁺-type source region 5 and the p⁺⁺-type contact region 6 are selectively formed in the p-type silicon carbide layer 43. A portion of the p-type silicon carbide layer 43 excluding the n⁺-type source region 5 and the p⁺⁺-type contact region 6 constitutes the p-type base region 4. The trench 7 penetrates the n⁺-type source region 5 and the p-type base region 4 in the depth direction from the front surface of the semiconductor substrate 10 and terminates in the n⁻-type silicon carbide layer 42. A width of the trench 7, for example, is in a range from about 0.5 μm to 1 μm.

The gate electrode 9 is provided in the trench 7, via the gate insulating film 8. A recess 9a having a substantially V-shaped cross-sectional shape that is deepest toward the drain at substantially a center portion of the trench 7 is formed in an upper surface of the gate electrode 9, as a consequence of etch back of poly-silicon for forming the gate electrode 9 described hereinafter. The upper surface of the gate electrode 9 is a surface of the gate electrode 9, the surface that is nearest an opening of the trench 7, and is a contact surface that is in contact with the interlayer insulating film 11. The interlayer insulating film 11 is provided on the front surface of the semiconductor substrate 10.

A contact hole 12 is provided that penetrates the interlayer insulating film 11 in the depth direction and exposes the n⁺-type source region 5 and the p⁺⁺-type contact region 6. The interlayer insulating film 11, for example, is formed by a non-doped silicate glass (NSG), a phosphosilicate glass (PSG), a borophosphosilicate glass (BPSG), a high temperature oxide (HTO), or a combination thereof.

By providing the contact hole 12 in the interlayer insulating film 11, the interlayer insulating film 11, in an active region, is provided only on top of the gate electrode 9 and the trench 7 so as to cover the gate electrode 9 and the trench 7. The active region is a region in which current flows when the MOSFET is in the ON state. At an upper surface 11c of the interlayer insulating film 11, a recess 11a corresponding to the recess 9a of the upper surface of the gate electrode 9 is formed in a portion that opposes in the depth direction, the recess 9a of the upper surface of the gate electrode 9 below. The recess 11a of the upper surface 11c of the interlayer insulating film 11 has a width and a cross-sectional shape that are substantially similar to a width and a cross-sectional shape of the recess 9a of the upper surface of the gate electrode 9.

The upper surface 11c of the interlayer insulating film 11 is a portion of a surface of the interlayer insulating film 11, the surface facing toward the barrier metal 13, excluding a surface (side surface of the interlayer insulating film 11) constituting a side wall of the contact hole 12. In particular, the upper surface 11c of the interlayer insulating film 11 is a portion of the surface facing toward the barrier metal 13, between vertex portions 11b that connect the recess 11a formed by the recess 9a of the upper surface of the gate electrode 9 below and the side surface of the interlayer insulating film 11. The vertex portions 11b of the interlayer insulating film 11 oppose in the depth direction, upper corner portions of the trench 7, the upper corner portions forming corners by the recess 9a of the upper surface of the gate electrode 9.

The upper corner portions of the trench 7 are boundaries between the front surface of the semiconductor substrate 10 and side walls of the trench 7. The upper corner portions of the trench 7 are exposed between the front surface of the semiconductor substrate 10 and the upper surface of the gate electrode 9, and form vertex portions coupling the front surface of the semiconductor substrate 10 and the upper surface of the gate electrode 9. The upper corner portions of the trench 7, at the surface continuous from the front surface of the semiconductor substrate 10 and spanning the upper surface of the gate electrode 9, is raised in a mountain-like shape.

The barrier metal 13 is constituted by first to fourth metal films 31 to 34 that are sequentially stacked. The first metal film 31 covers a surface of the interlayer insulating film 11. The first metal film 31, for example, is a titanium nitride (TiN) film (first titanium nitride film). The first metal film 31 has a thickness, for example, that is at most ⅕ of a thickness of the barrier metal 13. The first metal film 31 has a function of preventing metal atoms in the source electrode 14 from penetrating the interlayer insulating film 11 during annealing for converting a source electrode 14 described hereinafter into a silicide.

The source electrode (first electrode) 14 forms an ohmic contact with the n$^+$-type source region 5 and the p$^{++}$-type contact region 6, in the contact hole 12 of the interlayer insulating film 11. The source electrode 14 is a metal film that contains nickel silicide (NiSi) that results from a reaction of, for example, nickel atoms in a nickel (Ni) film 53 deposited on the front surface of the semiconductor substrate 10, in the contact hole 12 (refer to FIG. 8) and silicon atoms in the semiconductor substrate 10.

An opening 35 that exposes the recess 11a of the upper surface 11c of the interlayer insulating film 11 is provided in the first metal film 31. The opening 35 of the first metal film 31 has a function of mitigating stress applied to the first metal film 31 as a consequence of expansion and contraction of the interlayer insulating film 11 during an annealing process performed after the formation of the barrier metal 13. At least a portion that is deepest of the recess 11a of the upper surface 11c of the interlayer insulating film 11 may be exposed in the opening 35 of the first metal film 31.

The source electrode 14 suffices to be formed so that the nickel film 53 constituting the source electrode 14 does not adhere in the opening 35 of the first metal film 31, and the upper surface 11c of the interlayer insulating film 11 overall is exposed in the opening 35 of the first metal film 31. In other words, one end of the first metal film 31 terminates at the vertex portions 11b of the interlayer insulating film 11, or terminates closer to the recess 11a of the upper surface 11c of the interlayer insulating film 11 than are the vertex portions 11b of the interlayer insulating film 11.

The opening 35 of the first metal film 31 has a width that is at most equal to a distance between the vertex portions 11b of the interlayer insulating film 11, where being less than the distance between the vertex portions 11b of the interlayer insulating film 11 is advantageous. Effects of providing the first metal film 31 are obtained the smaller is the width of the opening 35 of the first metal film 31. In particular, the width of the opening 35 of the first metal film 31, for example, is at least about 0.3 µm, which is a process limit of etching of the first metal film 31 and is at most about the same as a width of the trench 7.

In particular, the width of the opening 35 of the first metal film 31, for example, may be in a range from about 0.5 µm to 1.5 µm, or may be, for example, in a range from about 0.8 µm to 1.2 µm. Further, the opening 35 of the first metal film 31 may be formed so as to be symmetrical to a portion that is deepest of the recess 11a of the upper surface 11c of the interlayer insulating film 11, in a direction parallel to the front surface of the semiconductor substrate 10.

Another end of the first metal film 31 may terminate on the front surface of the semiconductor substrate 10, in the contact hole 12 of the interlayer insulating film 11. In other words, the first metal film 31 suffices to cover the interlayer insulating film 11 and the gate insulating film 8 so that the interlayer insulating film 11 and the gate insulating film 8 are not exposed in the contact hole 12 of the interlayer insulating film 11.

Further, for example, when the trench 7 is disposed in a linear shape extending parallel to the front surface of the semiconductor substrate 10, the opening 35 of the first metal film 31 may be formed along a longitudinal direction in which the trench 7 extends parallel to the front surface of the semiconductor substrate 10 overall. The opening 35 of the first metal film 31 may be formed in a regular pattern along the longitudinal direction of the trench 7 and this planar pattern maybe variously modified.

In particular, the opening 35 of the first metal film 31, for example, may be formed in a linear shape that extends along the longitudinal direction of the trench 7. Further, the opening 35 of the first metal film 31, for example, may be formed in a pattern in which cuts inserted in a lateral direction that is parallel to the front surface of the semiconductor substrate 10 and orthogonal to the longitudinal direction of the trench 7 are continuous in a comb-like shape along the longitudinal direction of the trench 7.

The opening 35 of the first metal film 31 has a function of absorbing stress applied to the barrier metal 13 as a consequence of expansion and contraction of the interlayer insulating film 11, during an annealing process performed after the formation of the barrier metal 13 described hereinafter, and a function of preventing distortion of the barrier metal 13 (particularly, the first metal film 31). The opening 35 of the first metal film 31 is an escape path along which the flow of stress applied to the barrier metal 13 escapes toward upper layers (toward the fourth metal film 34) of the barrier metal 13.

The second metal film 32 of the barrier metal 13 is provided at a surface of the first metal film 31 and the source electrode 14 overall, so as to be embedded in the opening 35 of the first metal film 31. The second metal film 32 is curved along the interlayer insulating film 11 and the first metal film 31 therebelow. Further, the second metal film 32 is in contact with the interlayer insulating film 11, in the opening 35 of the first metal film 31. The second metal film 32, for example, is a titanium (Ti) film (first titanium film).

The second metal film 32 has a function of adsorbing hydrogen (H) atoms (or hydrogen ions) contained in a source pad 15 constituted by an aluminum (Al) deposited by a general method. By providing the second metal film 32, hydrogen atoms contained in the source pad 15 may be suppressed from migrating toward the interlayer insulating film 11 and diffusing near the gate insulating film 8. Therefore, a gate threshold voltage and other characteristics may be suppressed from varying from set values.

Further, the second metal film 32 and the interlayer insulating film 11 that are in contact with each other in the opening 35 of the first metal film 31 have poor adhesion due to titanium and boron contained therein respectively. In the opening 35 of the first metal film 31, poor adhesion of contact between the second metal film 32 and the interlayer insulating film 11 also has an effect of mitigating stress applied to the barrier metal 13 as a consequence of the expansion and the contraction of the interlayer insulating film 11 during an annealing process performed after the formation of the barrier metal 13.

The third and the fourth metal films 33, 34 of the barrier metal 13 are sequentially provided on a surface of the second metal film 32 overall, and the source pad 15 is provided on a surface of the fourth metal film 34 overall. The third metal film 33, for example, is a titanium nitride film (second titanium nitride film). An instance where the third metal film 33 disappears due to a reaction of the fourth metal film 34 thereabove with the source pad 15 has a function of preventing contact between the source pad 15 and the second metal film 32.

By providing the third metal film 33, the second metal film 32 therebelow may be prevented from reacting with the source pad 15 and forming an alloy. Therefore, a reduced effect of adsorption of hydrogen atoms of the second metal film 32 may be prevented. The fourth metal film 34 is a titanium film (second titanium film). The fourth metal film 34 may be reacted with the source pad 15 and converted into an alloy. The fourth metal film 34 has a function of enhancing adhesion between the barrier metal 13 and the source pad 15.

The source pad 15 is an aluminum film or an aluminum alloy film such as an aluminum-silicon (AlSi) film, an aluminum-silicon-copper (AlSiCu) film, etc. A drain electrode (second electrode) 16 is provided at a rear surface of the semiconductor substrate 10 overall. The drain electrode 16 forms an ohmic contact with the $n^+$-type drain region 1 that is constituted by the $n^+$-type starting substrate 41.

Figure 2:
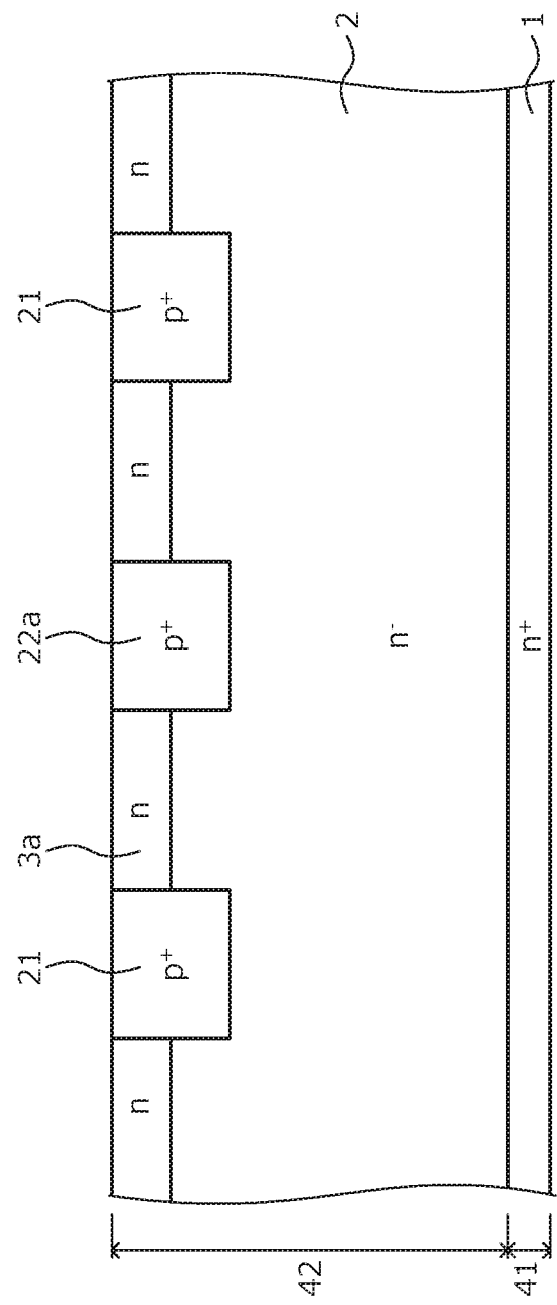
FIG. 2 is a cross-sectional view of the silicon carbide semiconductor device according to the first embodiment during manufacture.

A method of manufacturing the silicon carbide semiconductor device according to the first embodiment will be described. FIGS. 2, 3, 4, 5, 6, 7, 8, 9, and 10 are cross-sectional views of the silicon carbide semiconductor device according to the first embodiment during manufacture. First, as depicted in FIG. 2, the $n^+$-type starting substrate 41 that constitutes the $n^+$-type drain region 1 is prepared. Next, on the front surface of the $n^+$-type starting substrate 41, the $n^-$-type silicon carbide layer 42 that constitutes the $n^-$-type drift region 2 is formed by epitaxial growth.

Next, by photolithography and ion implantation of a p-type impurity, in a surface layer of the $n^-$-type silicon carbide layer 42, the first $p^+$-type region 21 and a $p^+$-type region 22a are selectively formed. The $p^+$-type region 22a is a portion of the second $p^+$-type region 22. Next, an n-type impurity is ion implanted, thereby forming in the surface layer of the $n^-$-type silicon carbide layer 42 overall an n-type region 3a. The n-type region 3a is a portion of the n-type current diffusion region 3. A sequence in which these regions are formed may be interchanged.

A temperature of the ion implantation may be a room temperature (less than 200 degrees C.) or may be a high temperature (from about 200 degrees C. to 500 degrees C.). For example, when the ion implantation is performed at the room temperature, a resist film is used as a mask, and when the ion implantation is performed at the high temperature, an oxide film ($SiO_2$) is used as a mask (similarly for all ion implantations described hereinafter). A portion of the $n^-$-type silicon carbide layer 42 excluding the first $p^+$-type region 21, the $p^+$-type region 22a, and the n-type region 3a constitutes the $n^-$-type drift region 2.

Figure 3:
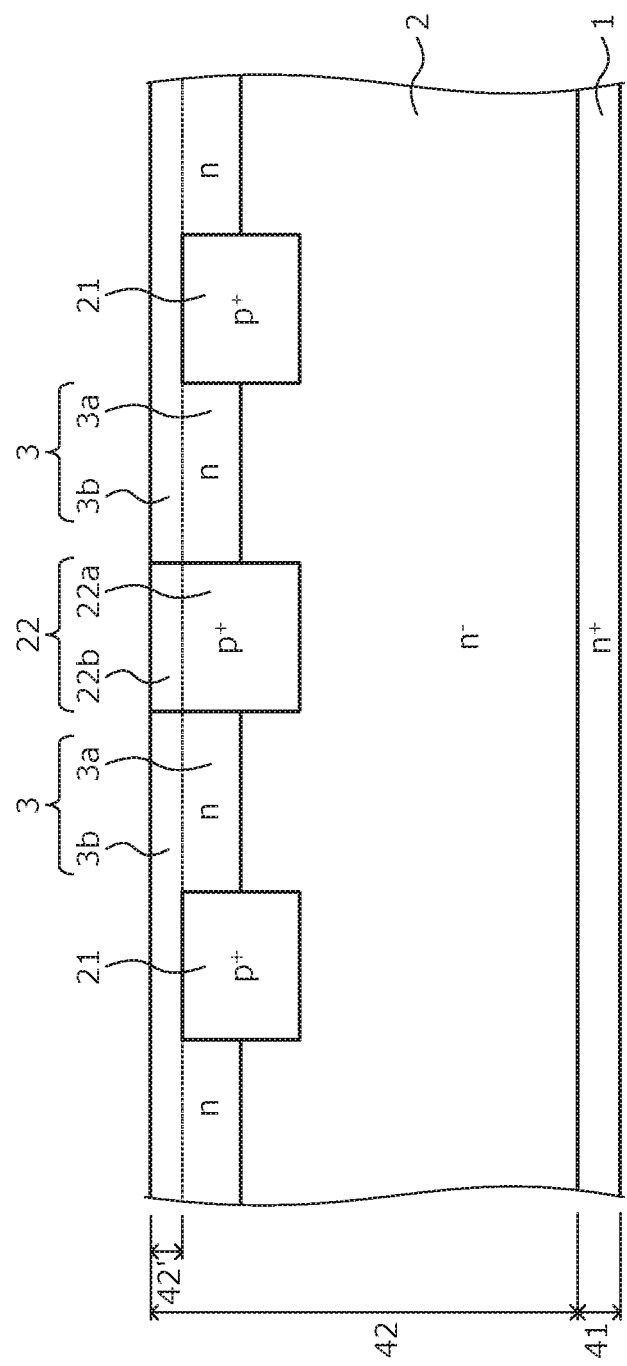
FIG. 3 is a cross-sectional view of the silicon carbide semiconductor device according to the first embodiment during manufacture.

Next, as depicted in FIG. 3, an $n^-$-type silicon carbide layer 42' is formed on the $n^-$-type silicon carbide layer 42 by epitaxial growth, thereby increasing a thickness of the $n^-$-type silicon carbide layer 42.

Next, by photolithography and ion implantation of a p-type impurity, at a portion of the portion 42' that increases the thickness of the $n^-$-type silicon carbide layer 42, the portion opposing the $p^+$-type region 22a in the depth direction, a $p^+$-type region 22b is selectively formed to a depth reaching the $p^+$-type region 22a. The $p^+$-type region 22b has a width and an impurity concentration that, for example, are substantially equal to a width and an impurity concentration of the $p^+$-type region 22a. The $p^+$-type regions 22a, 22b are connected along the depth direction, whereby the second $p^+$-type region 22 is formed.

Next, an n-type impurity is ion implanted overall in the portion 42' that increases the thickness of the $n^-$-type silicon carbide layer 42, thereby forming an n-type region 3b to a depth reaching the n-type region 3a. The n-type region 3b has an impurity concentration that may be substantially equal to that of the n-type region 3a. The n-type regions 3a, 3b are connected along the depth direction, whereby the n-type current diffusion region 3 is formed. A sequence in which the $p^+$-type region 22b and the n-type region 3b are formed may be interchanged.

Figure 4:
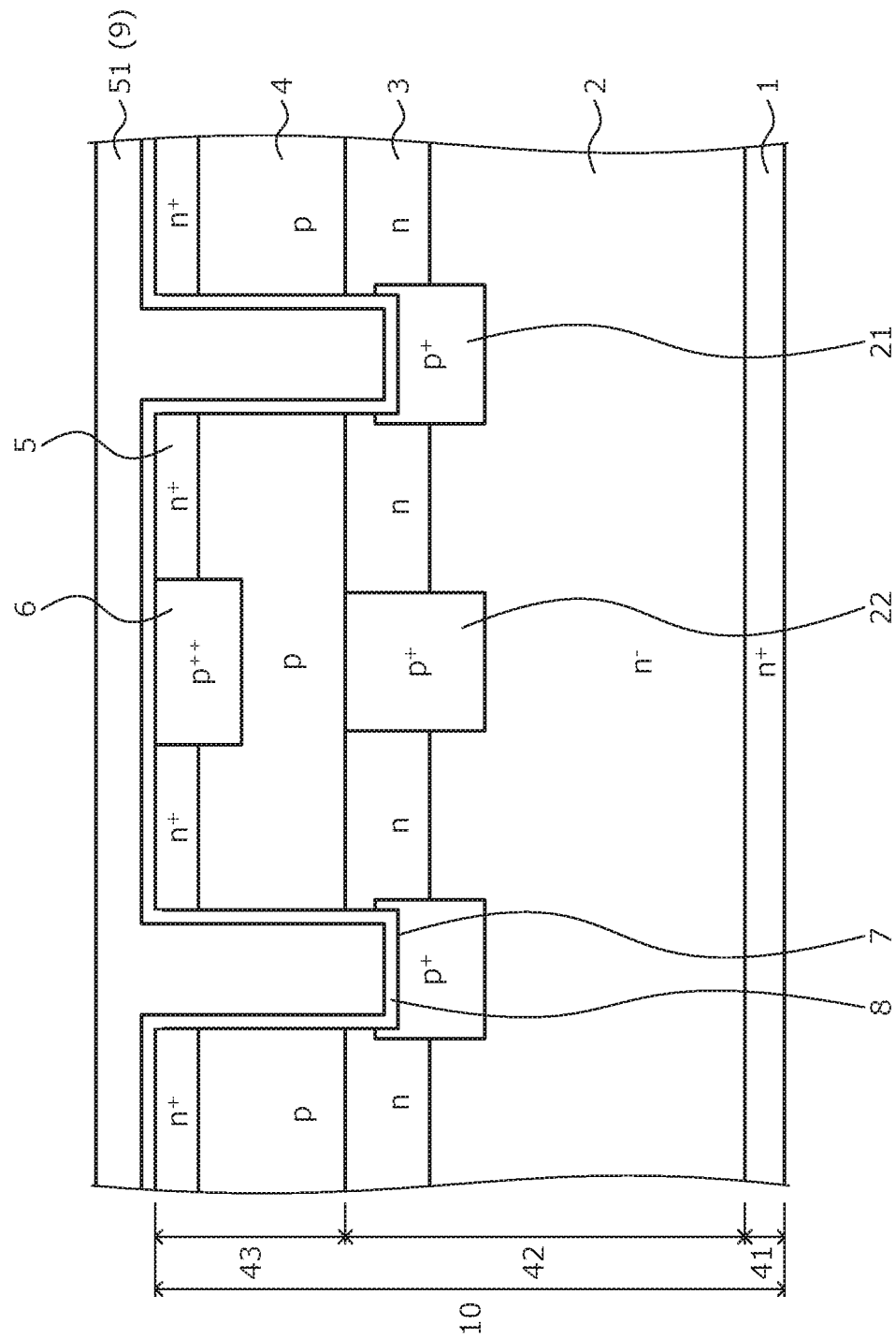
FIG. 4 is a cross-sectional view of the silicon carbide semiconductor device according to the first embodiment during manufacture.

Next, as depicted in FIG. 4, on the $n^-$-type silicon carbide layer 42, for example, the p-type silicon carbide layer 43 that constitutes the p-type base region 4 and that is doped with a p-type impurity such as aluminum is formed by epitaxial growth. The p-type silicon carbide layer 43 has a thickness and an impurity concentration that, for example, are about 1.3 μm and about $4 \times 10^{17}/cm^3$. By the processes up to here, the semiconductor substrate (semiconductor wafer) 10 in which the $n^-$-type silicon carbide layer 42 and the p-type silicon carbide layer 43 are sequentially deposited on the $n^+$-type starting substrate 41 is fabricated.

Next, by photolithography and ion implantation of an n-type impurity, in the p-type silicon carbide layer 43, the $n^+$-type source region 5 is selectively formed in a surface layer at the front surface of the semiconductor substrate 10. Further, by photolithography and ion implantation of a p-type impurity, in the p-type silicon carbide layer 43, the $p^{++}$-type contact region 6 is selectively formed in the surface layer at the front surface of the semiconductor substrate 10. A sequence in which the $n^+$-type source region 5 and the $p^{++}$-type contact region 6 are formed may be interchanged.

Next, after formation of all regions that are to be formed by ion implantation, annealing (heat treatment) for activating all the regions formed by ion implantation is performed. An annealing temperature for this activation, for example, is in a range from about 1500 degrees C. to 1900 degrees C. Further, the annealing for this activation is performed after, for example, a carbon (C) film is formed on both surfaces of the semiconductor substrate 10 by a sputtering method, thereby enabling surface roughness of the semiconductor substrate 10 to be suppressed.

Next, by photolithography and etching, the trench 7 is formed to penetrate the $n^+$-type source region 5 and the p-type base region 4, and reach the first $p^+$-type region 21 in the n-type current diffusion region 3. For example, an oxide film may be used as an etching mask for forming the trench 7. After formation of the trench 7, isotropic etching for removing etching damage occurring at an inner wall of the trench 7 may be performed.

Further, after formation of the trench 7, hydrogen annealing for rounding the upper corner portions and bottom corner portions of the trench 7 may be performed. The bottom corner portion of the trench 7 is a boundary between the bottom and a side wall of the trench 7. When both the isotropic etching for removing the etching damage at the inner wall of the trench 7 and the hydrogen annealing for rounding the bottom and the upper corner portions of the trench 7 are performed, the hydrogen annealing may be performed after the isotropic etching.

Next, the gate insulating film 8 is formed along the front surface of the semiconductor substrate 10 and the inner wall of the trench 7. Next, a poly-silicon layer 51 is deposited on the gate insulating film 8 in the trench 7 so that the trench 7 is completely embedded with the poly-silicon layer 51 on the gate insulating film 8. Here, the poly-silicon layer 51 is further deposited on the gate insulating film 8 at the front surface of the semiconductor substrate 10 so as to have a thickness that is substantially half the width of the trench 7 or more.

Figure 5:
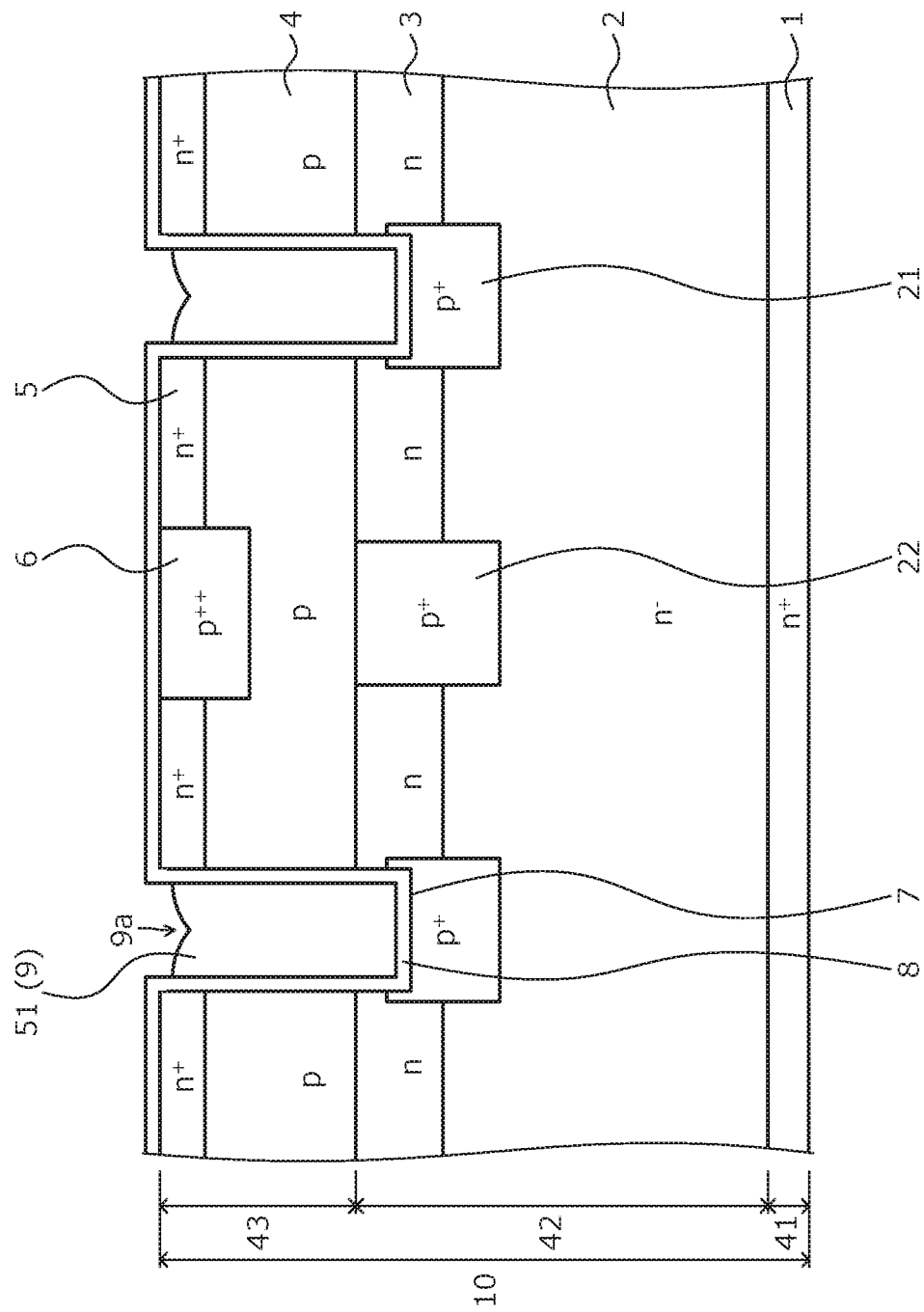
FIG. 5 is a cross-sectional view of the silicon carbide semiconductor device according to the first embodiment during manufacture.

Next, as depicted in FIG. 5, the poly-silicon layer 51 is etched so that the poly-silicon layer 51 on the front surface of the semiconductor substrate 10 is removed and only the poly-silicon layer 51 that constitutes the gate electrode 9 remains in the trench 7. By this etching, the upper surface of the gate electrode 9 becomes lower and deeper (toward the rear surface of the semiconductor substrate 10) than is the front surface of the semiconductor substrate 10, whereby the recess 9a that has a substantially V-shaped cross-sectional shape having a deepest portion that is deepest at substantially the center portion of the trench 7 occurs at the upper surface of the gate electrode 9.

Figure 6:
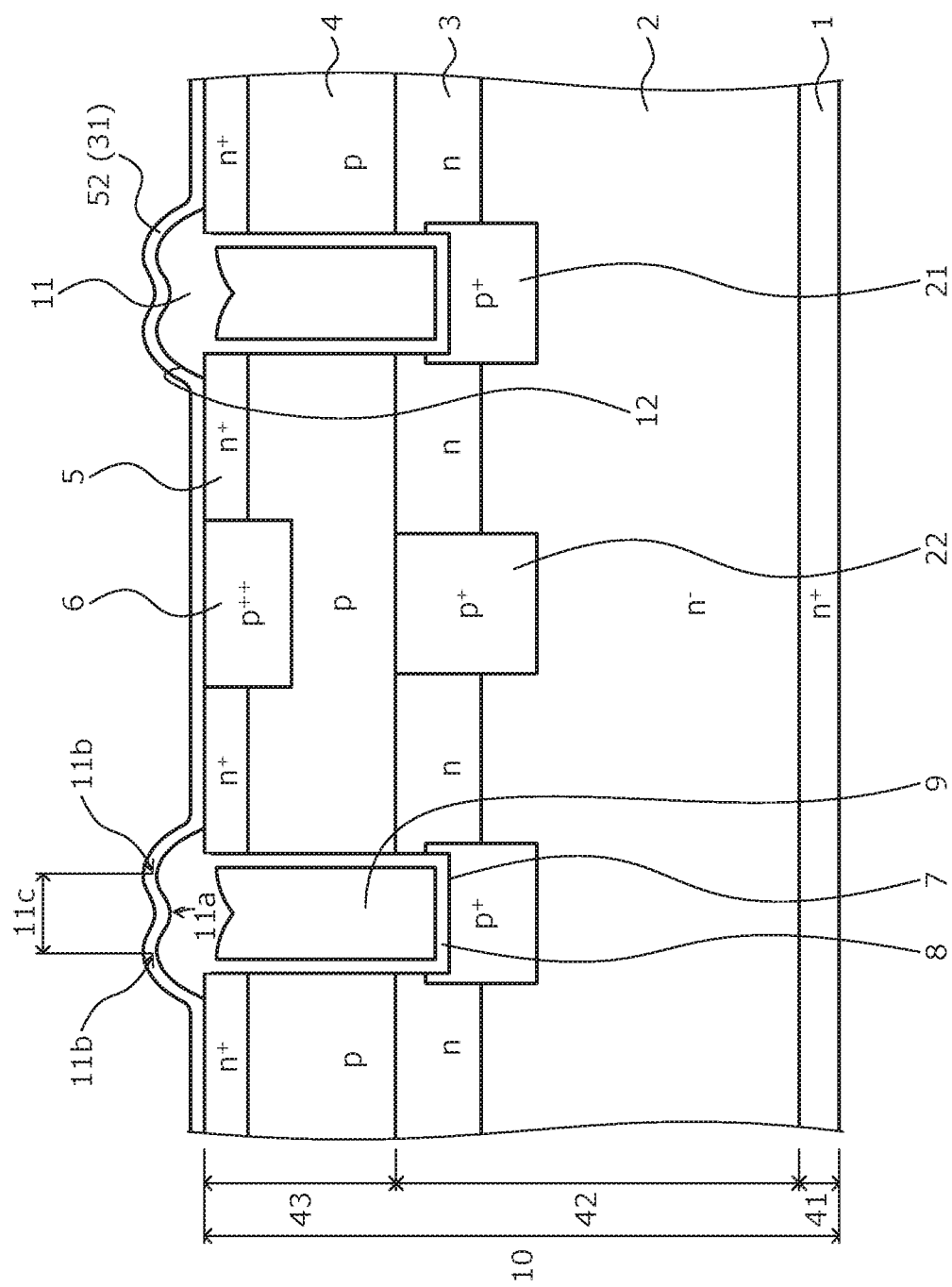
FIG. 6 is a cross-sectional view of the silicon carbide semiconductor device according to the first embodiment during manufacture.

Next, as depicted in FIG. 6, the interlayer insulating film 11 is deposited on the front surface of the semiconductor substrate 10 overall so as to cover the gate electrode 9. Here, at the upper surface of the interlayer insulating film 11, due to the recess 9a of the upper surface of the gate electrode 9 therebelow, the recess 11a is formed that has a cross-sectional shape and a width that are substantially the same as the cross-sectional shape and the width of the recess 9a of the upper surface of the gate electrode 9. Next, the interlayer insulating film 11 is planarized by a heat treatment (reflow). After this reflow, at the upper surface of the interlayer insulating film 11, the recess 11a remains that occurs during deposition of the interlayer insulating film 11 as a consequence of the recess 9a of the upper surface of the gate electrode 9 therebelow.

Next, by photolithography and etching, the interlayer insulating film 11 and the gate insulating film 8 are selectively removed, whereby the contact hole 12 is formed to penetrate the interlayer insulating film 11 and the gate insulating film 8 in the depth direction, and reach the semiconductor substrate 10. In the contact hole 12, the $n^+$-type source region 5 and the $p^{++}$-type contact region 6 are exposed. Next, for example, a titanium nitride film 52 that constitutes the first metal film 31 of the barrier metal 13 is formed so as to cover the interlayer insulating film 11.

Figure 7:
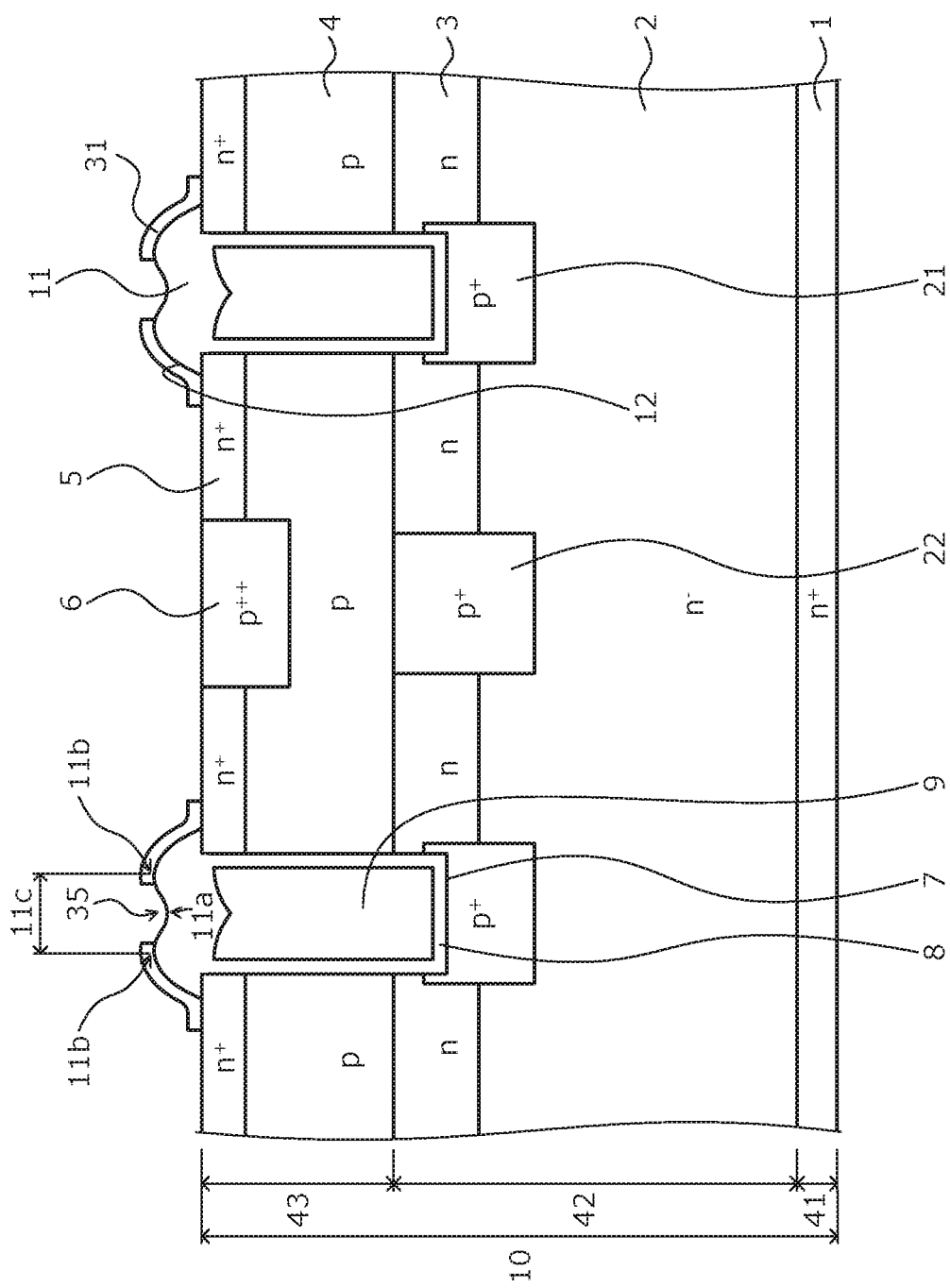
FIG. 7 is a cross-sectional view of the silicon carbide semiconductor device according to the first embodiment during manufacture.

Next, as depicted in FIG. 7, by photolithography and etching, the titanium nitride film 52 is selectively removed, thereby re-exposing the $n^+$-type source region 5 and the $p^{++}$-type contact region 6 in the contact hole 12. Additionally, of the titanium nitride film 52, a portion that constitutes the first metal film 31 remains on the surface of the interlayer insulating film 11. Furthermore, by etching, a groove is formed to penetrate the first metal film 31 in the depth direction, whereby in the first metal film 31, the opening 35 is formed to expose the recess 11a of the upper surface 11c of the interlayer insulating film 11.

Figure 8:
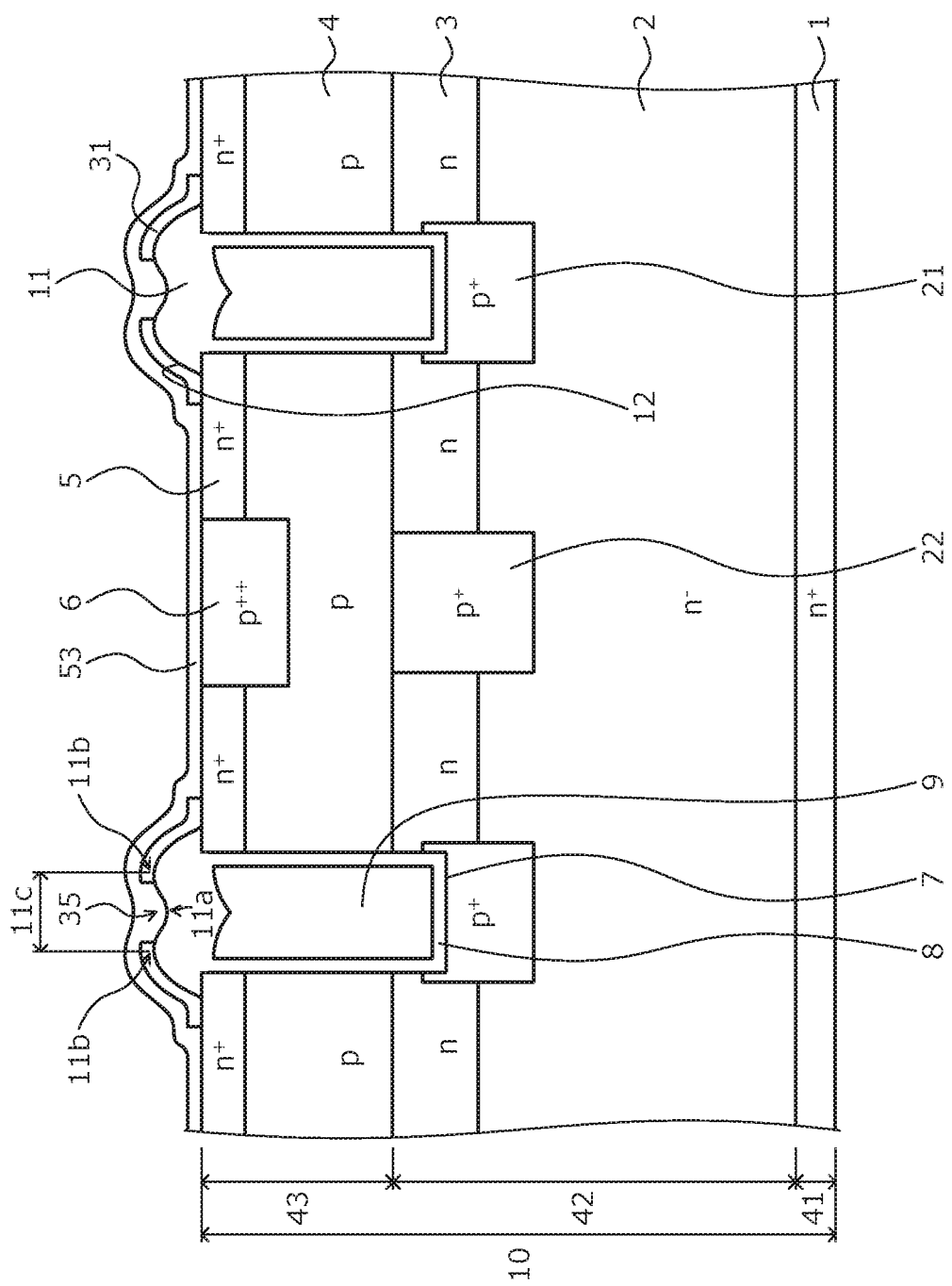
FIG. 8 is a cross-sectional view of the silicon carbide semiconductor device according to the first embodiment during manufacture.

Next, as depicted FIG. 8, for example, by sputtering, on the front surface of the semiconductor substrate 10, for example, the nickel film 53 that constitutes the gate electrode 9 is deposited in the contact hole 12. Here, while the nickel film 53 is formed on the surface of the first metal film 31 and in the opening 35 of the first metal film 31, the nickel film 53 suffices to cover only the front surface of the semiconductor substrate 10 in the contact hole 12 overall.

Figure 9:
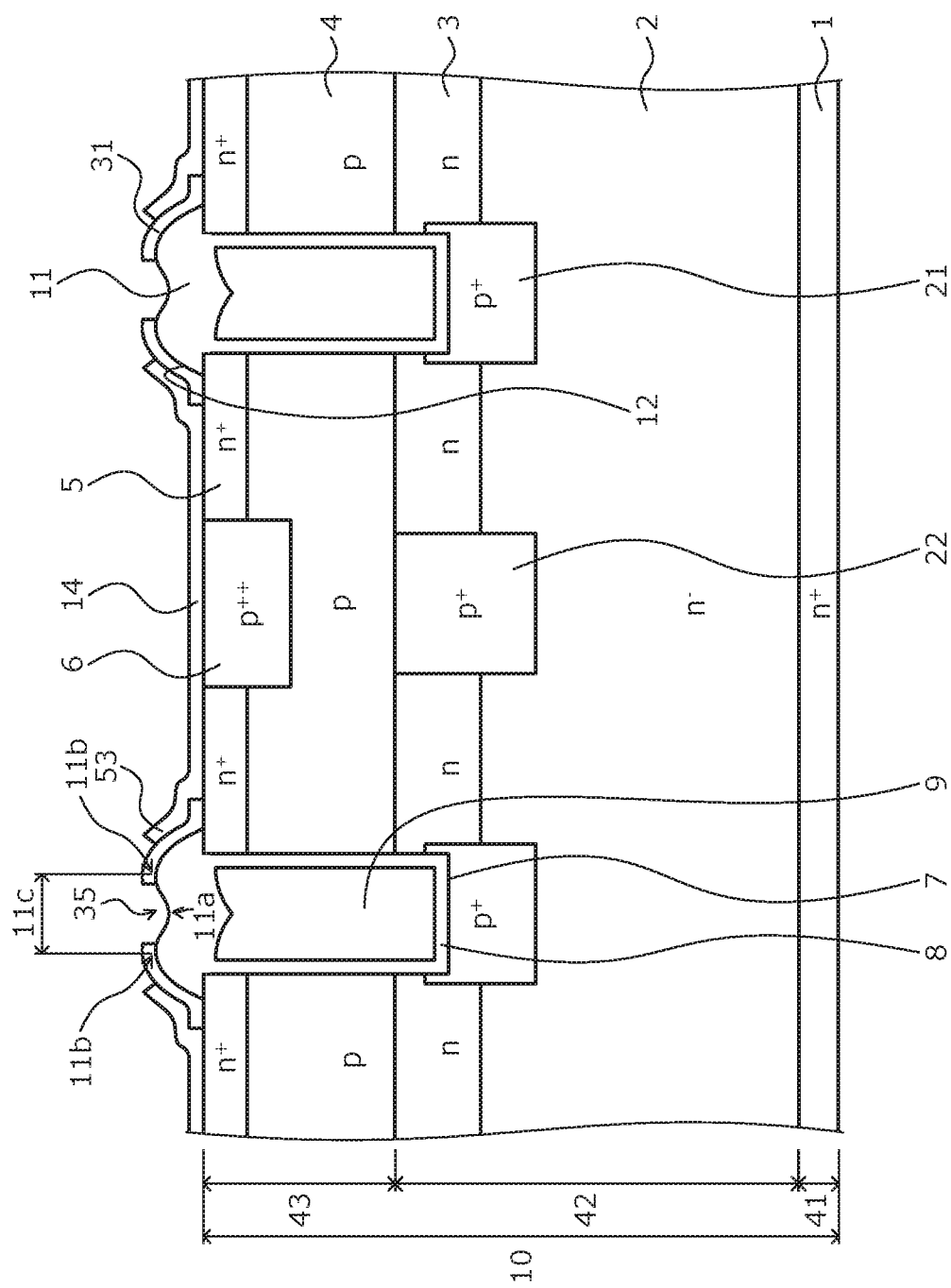
FIG. 9 is a cross-sectional view of the silicon carbide semiconductor device according to the first embodiment during manufacture.

Next, as depicted in FIG. 9, by photolithography and etching, the nickel film 53 is selectively removed to so that a portion of the nickel film 53 on the front surface of the semiconductor substrate 10 in the contact hole 12 remains and at least a portion of the nickel film 53 in the opening 35 of the first metal film 31 is removed because in the opening 35 of the first metal film 31, unfavorable instances between the gate and the source may occur due to the nickel film 53 in contact with the interlayer insulating film 11.

Next, by a heat treatment (sintering), nickel atoms in the nickel film 53 and silicon atoms in the semiconductor substrate 10 in the contact hole 12 reach with each other to form a nickel silicide. As a result, the source electrode 14 that contains the nickel silicide forms an ohmic contact with the semiconductor substrate 10. Here, a portion of the nickel film 53 on the first metal film 31 does not react with the silicon atoms in the semiconductor substrate 10.

Figure 10:
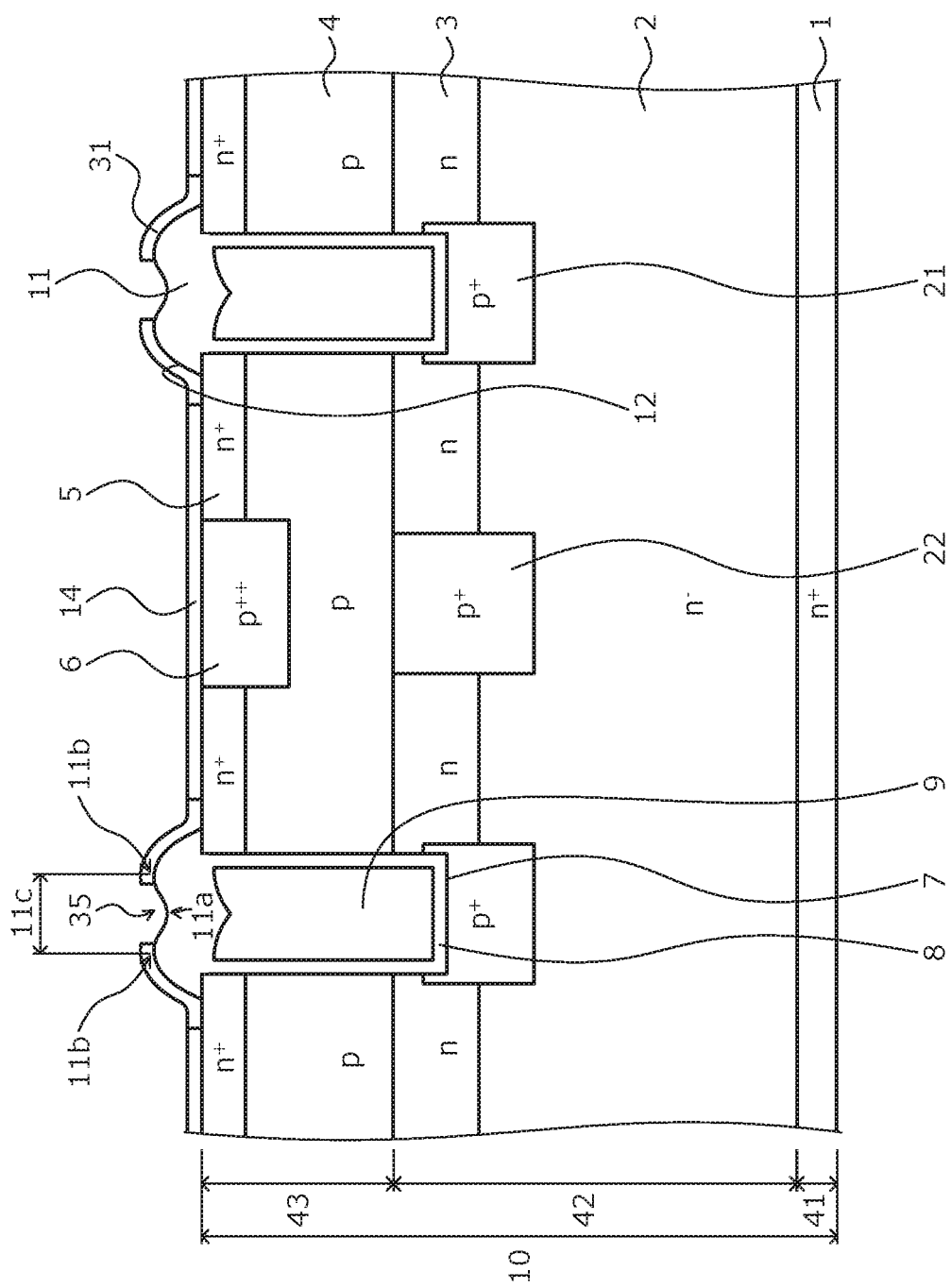
FIG. 10 is a cross-sectional view of the silicon carbide semiconductor device according to the first embodiment during manufacture.

Next, as depicted in FIG. 10, by etching, a portion of the nickel film 53 on the first metal film 31 is removed, and only a portion of the nickel film 53 constituting the gate electrode 9 that is converted into a silicide by the reaction with the semiconductor substrate 10 in the contact hole 12 remains. Next, for example, by sputtering, on the surfaces of the first metal film 31 and the source electrode 14 overall, the second metal film 32 of the barrier metal 13 is formed so as to be embedded in the opening 35 of the first metal film 31.

Next, for example, by sputtering, the third and the fourth metal films 33, 34 of the barrier metal 13 are sequentially deposited on the surface of the second metal film 32 overall. Next, for example, by sputtering, the source pad 15 is formed so as to be embedded in the contact hole 12. A portion of the metal film deposited for forming the source pad 15 may be used as a gate pad. For example, by sputtering, for example a metal film such as a nickel film or a titanium film is deposited on the rear surface of the semiconductor substrate 10 overall.

The metal film deposited on the rear surface of the semiconductor substrate 10 may be a stacked film formed by depositing a combination of a nickel film and/or a titanium film. Next, by a heat treatment (annealing) such as rapid thermal annealing (RTA), metal atoms in the metal film on the rear surface of the semiconductor substrate 10 and silicon atoms in the semiconductor substrate 10 react with each other and form a silicide. As a result, the metal film forms an ohmic contact with the semiconductor substrate 10.

Next, for example, by electron beam (EB) vapor deposition, a thick film such as a stacked film in which, for example, a titanium film, a nickel film, and a gold (Au) film are sequentially stacked is formed as the drain electrode 16 on the metal film that is converted in a silicide on the rear surface of the semiconductor substrate 10. Thereafter, the semiconductor substrate 10 is cut (diced) into individual chips, whereby the trench gate SiC-MOSFET depicted in FIG. 1 is completed.

In the method of manufacturing the silicon carbide semiconductor device, for example, nitrogen (N), phosphorus (P), arsenic (As), antimony (Sb), etc. that is an n-type with respect to silicon carbide suffices to be used as an n-type impurity (n-type dopant) used in epitaxial growth and ion implantation. As a p-type impurity (p-type dopant) used in epitaxial growth and ion implantation, for example, boron (B), aluminum (Al), gallium (Ga), indium (In), thallium (Tl), etc. that is a p-type with respect to silicon carbide suffices to be used.

As described above, according to the first embodiment, the opening that exposes the recess of the upper surface of the interlayer insulating film is provided in the first metal film that is a lowest layer of the barrier metal and that covers the interlayer insulating film, whereby during an annealing process performed after the formation of the barrier metal, stress applied to the first metal film due to the expansion and the contraction of the interlayer insulating film may be mitigated. As a result, the occurrence of cracks in the first metal film may be prevented, thereby enabling a reduction in unfavorable instances between the gate and the source. According to the first embodiment, this is particularly effective because when cell is wide, the width of the upper surface of the interlayer insulating film increases, and the stress applied to the barrier metal due to the expansion and the contraction of the interlayer insulating film during an annealing process performed after the formation of the barrier metal becomes large.

Figure 11:
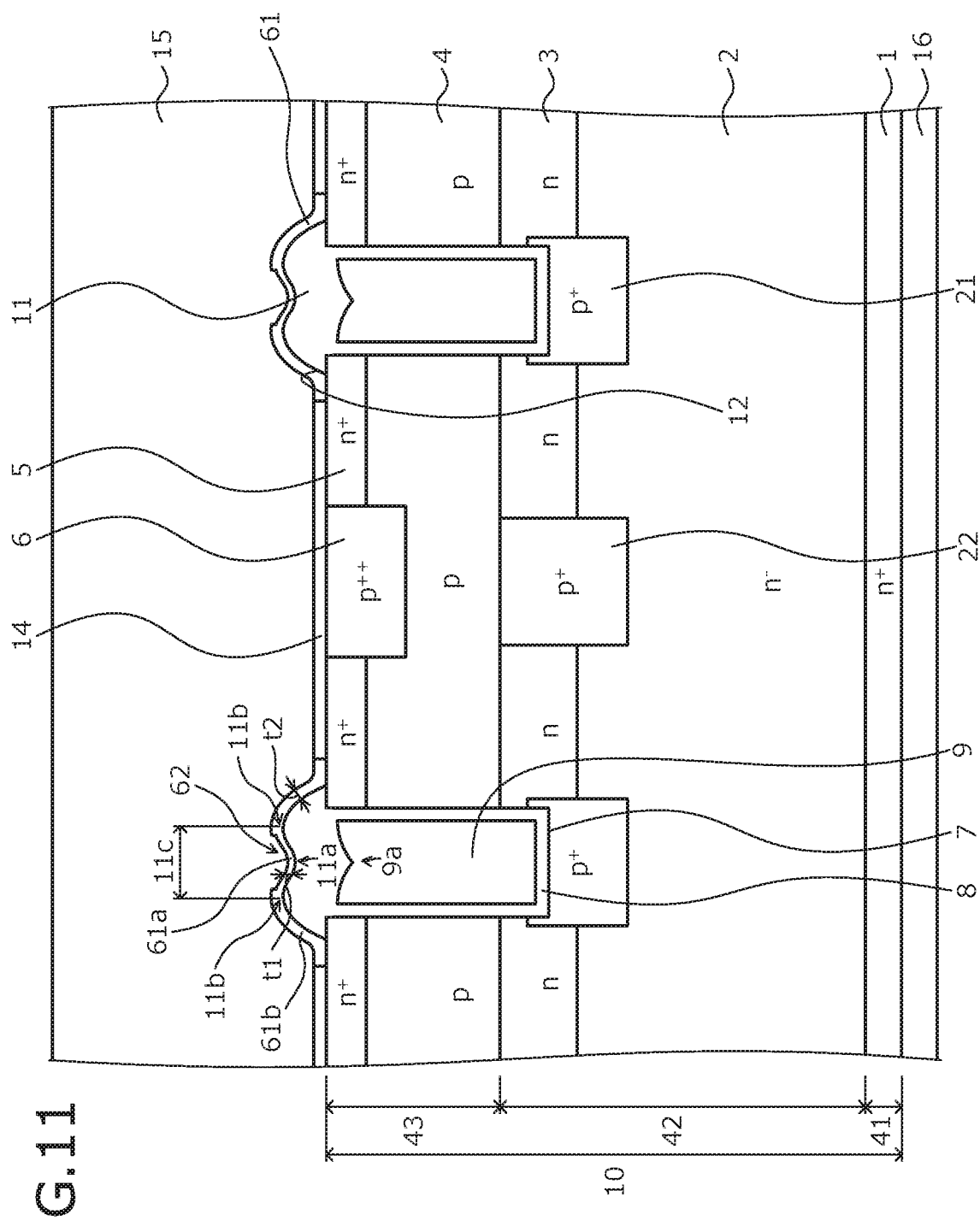
FIG. 11 is a cross-sectional view of a structure of the silicon carbide semiconductor device according to a second embodiment.

A structure of the silicon carbide semiconductor device according to a second embodiment will be described. FIG. 11 is a cross-sectional view of a structure of the silicon carbide semiconductor device according to the second embodiment. The silicon carbide semiconductor device according to the second embodiment differs from the silicon carbide semiconductor device according to the first embodiment in that a first metal film 61 that covers the interlayer insulating film 11 has a portion (hereinafter, first portion) 61a that covers the recess 11a of the upper surface 11c of the interlayer insulating film 11 and remains without being opened so as to have a thickness t1 that is thin.

The first metal film 61, which is the lowest layer of the barrier metal 13, is constituted by the first portion 61a that covers the recess 11a of the upper surface 11c of the interlayer insulating film 11 and a portion (hereinafter, second portion) 61b that excludes the first portion 61a. The second portion 61b is continuous with the first portion 61a and together with the first portion 61a constitutes one layer of the first metal film 61. The second portion 61b of the first metal film 61 covers a surface of the interlayer insulating film 11, the surface constituting a side wall of the contact hole 12.

In other words, in the first metal film 61 of the second embodiment, the first portion 61a is provided instead of the opening of the first metal film of the first embodiment. The first metal film 61 covers the entire surface of the interlayer insulating film 11 completely and is constituted by the first and the second portions 61a, 61b that are continuous and respectively have the thicknesses t1, t2 that differ. The first portion 61a of the first metal film 61 may cover at least a deepest portion of the recess 11a of the upper surface 11c of the interlayer insulating film 11.

Further, the first portion 61a of the first metal film 61 may cover the deepest portion of the recess 11a of the upper surface 11c of the interlayer insulating film 11 along a direction parallel to the front surface of the semiconductor substrate 10 and may be provided so as to be symmetrical with respect to the deepest portion. The first portion 61a of the first metal film 61 may cover the upper surface 11c of the interlayer insulating film 11 overall.

The first portion 61a of the first metal film 61 has a width that, similarly to the opening 35 of the first metal film 31 of the barrier metal 13 of the first embodiment (refer to FIG. 1), is at most the distance between the vertex portions 11b of the interlayer insulating film 11, or may be less than the distance between the vertex portions 11b of the interlayer insulating film 11. A particular value range of the width of the first portion 61a of the first metal film 61 is also similar to the width of the opening 35 of the first metal film 31 of the barrier metal 13 of the first embodiment. An end of the first metal film 61 may terminate on the front surface of the semiconductor substrate 10, in the contact hole 12 of the interlayer insulating film 11.

The thickness t1 of the first portion 61a of the first metal film 61 suffices to be a thickness that enables metal atoms in the source electrode 14 to be prevented from penetrating the interlayer insulating film 11 during annealing for silicide conversion of the source electrode 14 and, for example, may be at most about ⅕ of the thickness t2 of the second portion 61b of the first metal film 61. Further, the thickness t1 of the first portion 61a of the first metal film 61, for example, may be in a range from about 10 nm to 20 nm. A material of the first metal film 61 is the same as that of the first metal film of the barrier metal 13 of the first embodiment.

A method of manufacturing the silicon carbide semiconductor device according to the second embodiment, for example, includes in the method of manufacturing the silicon carbide semiconductor device according to the first embodiment, performing etching that forms a groove 62 at a depth so that a titanium nitride film remains having the thickness t1 in a portion that corresponds to a formation region of the first portion 61a of, for example, the titanium nitride film (corresponds to reference numeral 52 in FIG. 6) that constitutes the first metal film 61 of the barrier metal 13. Other than the etching that forms the groove 62, etching is performed for forming the contact hole 12 in the titanium nitride film that constitutes the first metal film 61.

As described above, according to the second embodiment, effects similar to those of the first embodiment may be obtained even in a case where instead of forming the opening in the first metal film that is the lowest layer of the barrier metal, a groove is formed in a portion of the first metal film to a depth that enables the thickness to be reduced without penetrating the first metal film.

Further, according to the second embodiment, the first metal film of the barrier metal completely covers the entire surface of the interlayer insulating film and therefore, during formation of the source electrode, for example, a nickel film that is deposited on the surface of the first metal film is not in contact with the interlayer insulating film. Therefore, before the annealing for converting the nickel film into a silicide to form the source electrode, an etching process for removing a portion where the nickel film that is in contact with the interlayer insulating film may be omitted.

Unfavorable instances between the gate and the source of the silicon carbide semiconductor devices according to the first and the second embodiments described above were verified. FIG. 12 is a table of unfavorable instances between a gate and a source of the silicon carbide semiconductor device according to first and second examples. The SiC-MOSFETs depicted in FIGS. 1 and 11 were fabricated (manufactured) according to the methods of manufacturing the silicon carbide semiconductor device according to the first and the second embodiments (hereinafter, the first and the second examples). Further, for comparison, the conventional SiC-MOSFET depicted in FIG. 13 was fabricated (hereinafter, conventional example). For the first and the second examples and the conventional example, the same number of semiconductor chips (samples) was prepared for each.

Further, for each of the samples of the first and the second examples, gate voltage of 25V was applied to the gate electrode 9, damaged sites of the samples in which an unfavorable instance occurred between the gate and the source were removed by a focused ion beam (FIB). Voltage applied to the source pads 15 and the drain electrodes 16 of the first and the second examples was 0V. With respect to the samples of the conventional example as well, under conditions identical to those for the first and the second examples, voltage was applied to the gate electrode 109, the source pad 115, and the drain electrode 116, and damaged sites of samples in which an unfavorable instance occurred between the gate and the source were removed by FIB.

Results of observing under a scanning electron microscope (SEM), the damaged sites that were removed from the samples of the first and the second examples and the conventional example are depicted in FIG. 12. An unfavorable instance is an occurrence of leak current between the gate and the source, or an occurrence of dielectric breakdown, or an occurrence of both. A rate of defects between the gate and the source is a ratio (=defective chip count/total chip count) of the defective chip count (defective sample count) to the total chip count (total sample count) of the chips prepared respectively for the first and the second examples and the conventional example. The defective chip count is the number of samples in which an unfavorable instance occurred between the gate and the source.

From the results depicted in FIG. 12, in the conventional example, in the samples in which dielectric breakdown occurred, cracks (fractures) in the barrier metal 113 were confirmed. In contrast, in the first and the second examples, as compared to the conventional example, it was confirmed that there were fewer samples in which an unfavorable instance occurred between the gate and the source and it was confirmed that no cracks occurred in the barrier metal 13. Therefore, it was confirmed that cracks in the barrier metal could be prevented by the structure of the silicon carbide semiconductor device according to the first and the second embodiments described above and as a result, unfavorable instances between the gate and source could be reduced to a greater extent than by the conventional structure (refer to FIG. 13).

In the foregoing, the present invention is not limited to the embodiments described and various modifications within a range not departing from the spirit of the invention are possible. For example, in the embodiments described, while a MOSFET has been described as an example, without limitation hereto, the present invention, for example, is further applicable to a MOS semiconductor device such as an insulated gate bipolar transistor (IGBT) or the like. Further, the present invention is similarly implemented when conductivity types (n-type, p-type) are reversed.

According to the embodiments of the invention, stress that is due to the expansion and the contraction of the interlayer insulating film during an annealing process performed after the formation of the barrier metal and that is applied to the first titanium nitride film that is the lowest layer of the barrier metal may be mitigated.

The silicon carbide semiconductor device and method of manufacturing a silicon carbide semiconductor device according to the present invention enable cracking of the barrier metal that covers the interlayer insulating film to be prevented and thereby, achieve an effect in that unfavorable instances between the gate and the source may be reduced.

As described, the silicon carbide semiconductor device and the method of manufacturing a silicon carbide semiconductor device according to the present invention are useful for power semiconductor devices used in power converting equipment and in power supply devices such as in various industrial machines, and are particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate that contains silicon carbide, the semiconductor substrate including:
      a base substrate;
      a first semiconductor region that is of a first conductivity type and is disposed on the base substrate at a front side of the semiconductor substrate;
      a second semiconductor region that is of a second conductivity type, and is disposed on the first semiconductor region at the front side of the semiconductor substrate; and
      a third semiconductor region that is of the first conductivity type and is selectively provided in the second semiconductor region at the front side of the semiconductor substrate;
   a trench that penetrates the third semiconductor region and the second semiconductor region, and reaches the first semiconductor region;
   a gate electrode that is provided in the trench, via a gate insulating film;
   an interlayer insulating film that covers the gate electrode;
   a contact hole that penetrates the interlayer insulating film, reaches the semiconductor substrate and exposes the third semiconductor region;
   a barrier metal that covers the interlayer insulating film;
   a first electrode that in the contact hole is electrically connected to the second semiconductor region and the third semiconductor region; and
   a second electrode provided at a rear side of the semiconductor substrate, wherein
   the gate electrode has a recess at a position corresponding to the trench in a plan view of the silicon carbide semiconductor device, the recess being recessed from the front side of the semiconductor substrate toward the rear side of the semiconductor substrate,
   the interlayer insulating film has a recess at a position corresponding to the position of the recess of the gate electrode in the plan view, and
   the barrier metal has a groove of a predetermined depth at a position corresponding to the position of the recess of the interlayer insulating film in the plan view, the barrier metal having a first portion in the groove and a second portion other than the first portion, the first portion having a thickness less than a thickness of the second portion.

2. The silicon carbide semiconductor device according to claim 1, wherein the groove of the barrier metal penetrates the barrier metal and exposes a surface of the recess of the interlayer insulating film.

3. The silicon carbide semiconductor device according to claim 1, wherein the thickness of the first portion of the barrier metal is at most one-fifth of a thickness of the second portion of the barrier metal.

4. The silicon carbide semiconductor device according to claim 1, wherein the groove has a width in a direction parallel to a surface of the semiconductor substrate in a range from 0.5 µm to 1.5 µm.

5. The silicon carbide semiconductor device according to claim 4, wherein the width of the groove is in a range from 0.8 µm to 1.2 µm.

6. The silicon carbide semiconductor device according to claim 1, wherein
   the recess of the gate electrode has a substantially V-shaped cross-sectional shape and has a deepest point at a center of the trench in the plan view,
   the recess of the interlayer insulating film has a substantially V-shaped cross-sectional shape corresponding to a shape of the recess of the gate electrode, and
   the groove overlaps in the plan view the deepest point of the recess of the interlayer insulating film.

7. The silicon carbide semiconductor device according to claim 1, wherein
   the barrier metal is a titanium nitride film.

8. The silicon carbide semiconductor device according to claim 1, wherein
   the barrier metal has a four-layer structure constituted by:
      a first titanium nitride film that directly contacts the interlayer insulating film and has the groove,
      a first titanium film that directly contacts the first titanium nitride film and the first electrode,
      a second titanium nitride film that directly contacts the first titanium film, and a second titanium film that directly contacts the second titanium nitride film.

9. The silicon carbide semiconductor device according to claim 1, wherein the barrier metal includes a plurality of metal layers including a lowermost layer that is in direct contact with the interlayer insulating film and a uppermost layer that is located farther than any other metal layer from the interlayer insulating film in a thickness direction, the lowermost layer having an opening penetrating therethrough at a position corresponding to the recess of the interlayer insulating film so that the thickness of the first portion is less than the thickness of the second portion.

10. A method of manufacturing the silicon carbide semiconductor device according to claim 1, the method comprising: fabricating the semiconductor substrate that contains silicon carbide, the semiconductor substrate including the base substrate, the first semiconductor region of the first conductivity type, disposed on the base substrate at the front side of the semiconductor substrate, and the second semiconductor region of the second conductivity type, disposed on the first semiconductor region at the front side of the semiconductor substrate; selectively forming the third semiconductor region of the first conductivity type in the second semiconductor region; forming the trench to penetrate the third semiconductor region and the second semiconductor region and reach the first semiconductor region; forming the gate insulating film along an inner wall of the trench; depositing a poly-silicon layer on a front surface of the semiconductor substrate and embedding the poly-silicon layer on the gate insulating film in the trench; etching and removing the poly-silicon layer with an etch back process to form the gate electrode in the trench; forming the interlayer insulating film to cover the gate electrode; forming the contact hole that penetrates the interlayer insulating to expose the third semiconductor region in the contact hole; forming the barrier metal to cover the interlayer insulating film; forming the first electrode that is electrically connected to the second semiconductor region and the third semiconductor region in the contact hole; and forming the second electrode at the rear side of the semiconductor substrate, wherein during the etch back process, a recess that is recessed from the front side of the semiconductor substrate toward the rear side of the semiconductor substrate is formed at a surface of the gate electrode, during the forming of the interlayer insulating film, a recess is formed at a surface of the interlayer insulating film at the position corresponding to the position of the recess of the gate electrode in the plan view of the silicon carbide semiconductor device, and forming the barrier metal includes forming the groove of the predetermined depth in the barrier metal at the position corresponding to the position of the recess of the interlayer insulating film in the plan view.

11. The method according to claim 10, wherein forming the groove of the barrier metal includes forming in the barrier metal an opening that penetrates the barrier metal to expose a surface of the recess of the interlayer insulating film.

12. The method according to claim 10, wherein forming the barrier metal includes forming in the barrier metal, a first portion at a position corresponding to the position of the recess of the interlayer insulating film in the plan view, the first portion having a thickness less than a thickness of the barrier metal other than the first portion.

13. A silicon carbide semiconductor device, comprising:
a semiconductor substrate that contains silicon carbide, the semiconductor substrate including:
    a base substrate;
    a first semiconductor region that is of a first conductivity type and is disposed on the base substrate at a front side of the semiconductor substrate;
    a second semiconductor region that is of a second conductivity type, and is disposed on the first semiconductor region at the front side of the semiconductor substrate; and
    a third semiconductor region that is of the first conductivity type and is selectively provided in the second semiconductor region at the front side of the semiconductor substrate;
a trench that penetrates the third semiconductor region and the second semiconductor region, and reaches the first semiconductor region;
a gate electrode that is provided in the trench, via a gate insulating film;
an interlayer insulating film that covers the gate electrode;
a contact hole that penetrates the interlayer insulating film and exposes the third semiconductor region;
a barrier metal that covers the interlayer insulating film;
a first electrode that in the contact hole is electrically connected to the second semiconductor region and the third semiconductor region; and
a second electrode provided at a rear side of the semiconductor substrate, wherein
the barrier metal has a four-layer structure constituted by:
    a first titanium nitride film that is disposed directly on the interlayer insulating film and has an opening that exposes a portion of the interlayer insulating film,
    a first titanium film that is disposed directly on the first titanium nitride film and the first electrode, and is in direct contact with the interlayer insulating film in the opening of the first titanium nitride film,
    a second titanium nitride film that is disposed directly on the first titanium film, and
    a second titanium film that is disposed directly on the second titanium nitride film.

* * * * *